United States Patent
El-Sharawy

(10) Patent No.: US 6,545,571 B2
(45) Date of Patent: Apr. 8, 2003

(54) TUNABLE $HE_{o\gamma\delta}$ MODE DIELECTRIC RESONATOR

(76) Inventor: El-Badawy Amien El-Sharawy, 1434 E. Spur Ave., Gilbert, AZ (US) 85296

( * ) Notice: Subject to any disclaimer, the term of this patent is extended or adjusted under 35 U.S.C. 154(b) by 35 days.

(21) Appl. No.: 09/955,378

(22) Filed: Sep. 12, 2001

(65) Prior Publication Data

US 2003/0048159 A1 Mar. 13, 2003

(51) Int. Cl.⁷ .................................. H03B 5/18
(52) U.S. Cl. ................... 333/235; 333/238; 333/219; 333/202
(58) Field of Search ................. 333/235, 202, 333/219, 238

(56) References Cited

U.S. PATENT DOCUMENTS

| | | | |
|---|---|---|---|
| 2,890,422 A | 6/1959 | Schlicke | 333/77 |
| 3,798,578 A | 3/1974 | Konishi et al. | 333/82 |
| 4,007,928 A | 2/1977 | Doubt | 273/32 |
| 4,273,329 A | 6/1981 | Trigg et al. | 273/32 |
| 4,521,746 A | 6/1985 | Hwan et al. | 331/96 |
| 4,620,169 A * | 10/1986 | Blickstein | 333/235 |
| 4,630,012 A | 12/1986 | Fuller | 333/235 |
| 4,639,690 A * | 1/1987 | Lewis | 333/235 |
| 4,652,843 A | 3/1987 | Tang et al. | 333/212 |
| 4,668,925 A | 5/1987 | Towatari et al. | 333/219 |
| 4,706,052 A | 11/1987 | Hattori et al. | 333/219 |
| 4,728,913 A | 3/1988 | Ishikawa et al. | 333/235 |
| 4,835,498 A | 5/1989 | Rauger et al. | 333/205 |
| 4,881,051 A | 11/1989 | Tang et al. | 333/208 |
| 5,065,119 A * | 11/1991 | Jachowski | 333/235 |
| 5,233,319 A * | 8/1993 | Mizan et al. | 333/235 |
| 5,311,160 A | 5/1994 | Higuchi et al. | 333/219 |
| 5,325,077 A | 6/1994 | Ishikawa et al. | 333/219 |
| 5,736,912 A | 4/1998 | Mikami et al. | 333/235 |
| 5,816,262 A | 10/1998 | Javnozon | 131/175 |
| 5,859,574 A | 1/1999 | Schmitt | 333/202 |
| D409,706 S | 5/1999 | Tate | D21/793 |
| 5,990,764 A | 11/1999 | Tanizaki et al. | 333/202 |
| 6,005,453 A | 12/1999 | Sarkka et al. | 333/126 |
| 6,030,298 A | 2/2000 | Tate | 473/408 |
| 6,050,905 A | 4/2000 | Tate | 473/408 |
| 6,169,467 B1 | 1/2001 | El-Sharawy | 333/219 |

FOREIGN PATENT DOCUMENTS

| | | | |
|---|---|---|---|
| EP | 492304 | 12/1991 | H01P/7/10 |
| JP | 161985 | 6/1985 | H01P/7/10 |
| WO | 9966582 | 12/1999 | |

OTHER PUBLICATIONS

By: Chng –Chyi You, Chng–Liang Huang and Chung–Chuang Wei Title: Single–Block Ceramic Microwave Bandpass Filters Date: Nov. 1994 pp.:24–35.

By: Trans –Tech Title: Dielectric Resonators and Related Products Date: Apr. 1993 Publication No. 50080040 Rev. 3.

* cited by examiner

Primary Examiner—Don Le
Assistant Examiner—Lam T. Mai
(74) Attorney, Agent, or Firm—Lowell W. Gresham; Meschkow & Gresham

(57) ABSTRACT

A $HE_{o\gamma\delta}$ mode dielectric resonator (12) includes a cylindrical dielectric disk (32) having top and bottom ends (20, 22) spaced apart by a closed curve wall (24). The dielectric disk (32) has a dielectric constant greater than 40. An axially aligned hole (36) is formed through the disk (32) between the top and bottom ends (20, 22). A conductive wall (34) is formed at the closed curved wall (24) but not the top and bottom ends (20, 22). The hole (36) has a preferred diameter less than 0.2 times the diameter of the disk. A tuning plug (30) is formed from a material having a dielectric constant less than 0.5 times the dielectric constant of the dielectric disk (32) and an unloaded quality factor greater than 2.0 times the unloaded quality factor of the dielectric disk (32). The tuning plug is inserted to a desired depth within the hole (36) of the dielectric disk (32).

20 Claims, 2 Drawing Sheets

US 6,545,571 B2

TUNABLE $HE_{0\gamma\delta}$ MODE DIELECTRIC RESONATOR

TECHNICAL FIELD OF THE INVENTION

The present invention relates to resonators used in RF communication and other equipment. More specifically, the present invention relates to a dielectric resonator configured to have a lowest resonant frequency in the $HE_{0\gamma\delta}$ mode.

BACKGROUND OF THE INVENTION

Dielectric resonators are smaller than air cavity resonators having equivalent resonant frequencies because wavelengths in the dielectric resonator are divided by the square root of the resonator's dielectric constant. In addition, reactive power need not be stored strictly inside the dielectric resonator, and fractional modes of resonance are possible.

Unfortunately, for many applications conventional dielectric resonators are still undesirably large and/or made from exotic materials that are too costly. Mass market portable RF communication devices represent one example of such applications. While most electronics equipment benefits from smaller, less expensive components, portable RF communication devices receive particular benefit because of a heightened need to be as small and lightweight as possible, while being as inexpensive as possible to effectively compete in a highly competitive marketplace.

U.S. Pat. No. 6,169,467, entitled "Dielectric Resonator Comprising A Dielectric Resonator Disk Having A Hole," and having a common inventive entity and assignee herewith is incorporated herein by reference. This patent teaches a $TE_{0\gamma\delta}$ mode dielectric resonator, where "$\gamma$" indicates a fraction of periodicity in the radial direction, and "$\delta$" indicates a fraction of periodicity in the axial direction. This $TE_{0\gamma\delta}$ mode resonator achieves a relatively small size due, in part, to the fractional mode of resonance in two dimensions while simultaneously achieving an excellent quality factor (Q). Unfortunately, to achieve the excellent quality factor sacrifices were made that resulted in a larger size and more expensive configuration than would be desired for many applications. Moreover, while most all applications benefit from a quality factor as high as possible, some applications do not require an excellent quality factor and can tolerate merely a good quality factor.

A conventional practice in using dielectric resonators is to configure the resonator to resonate in a TE mode within a cavity and to incorporate an adjustable tuning device. Conventional tuning devices have an adjustable position relative to a dielectric resonator within a conductive cavity. The use of a conductive cavity having walls positioned some distance away from the dielectric resonator is useful for maintaining as high a quality factor as possible, but increases size and cost accordingly. In some examples, the tuning devices are conductive members, but conductive tuning devices are not desired because they are lossy and diminish the quality factor of the resonator.

In other examples, the tuning devices are dielectric members having as high a dielectric constant and quality factor as possible. A high dielectric constant is desired to achieve an effective tuning range. Often, a dielectric tuning member is made from the same material as the dielectric resonator being tuned, but a material having an even greater dielectric constant would be desirable to increase tuning range. The use of a common dielectric material for the resonator and the tuning member is undesirable because dielectric materials tend to be expensive, and particularly expensive where small resonator size is a goal and more exotic dielectric materials having higher dielectric constants are being used. The use of a dielectric tuning member having a greater dielectric constant than the dielectric constant of the dielectric resonator would be even more expensive and therefore undesirable.

SUMMARY OF THE INVENTION

Accordingly, it is an advantage of the present invention that an improved $HE_{0\gamma\delta}$ mode dielectric resonator is provided.

Another advantage of the present invention is that a $HE_{0\gamma\delta}$ mode dielectric resonator is provided which achieves a good Q in a smaller volume than required by a TE mode dielectric resonator or other HE mode dielectric resonators at the same frequency.

Another advantage is that a tunable $HE_{0\gamma\delta}$ mode dielectric resonator is provided.

Still another advantage is that a tunable $HE_{0\gamma\delta}$ mode dielectric resonator is provided wherein tuning is accomplished at very low cost and with substantially no deterioration in quality factor.

The above and other advantages of the present invention are carried out in one form by a tunable $HE_{0\gamma\delta}$ mode dielectric resonator. This resonator includes a disk formed in the shape of a cylinder having a diameter D. The disk is formed from a first dielectric material configured to exhibit a dielectric constant $\in_r$. The disk has first and second opposing ends and a closed curve wall extending between the first and second ends. At least one of the first and second ends serves as a boundary between the disk and a second dielectric material. A hole penetrates the disk from the first end and extends toward the second end. The hole exhibits a diameter less than 0.2 D. The resonator also includes a conductive coating on the disk wall and a dielectric tuning plug. The dielectric tuning plug has a dielectric constant less than $0.5\in_r$ and extends into the hole in the disk. As a result, the tunable resonator has a lowest resonant frequency in a $HE_{0\gamma\delta}$ mode of oscillation.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
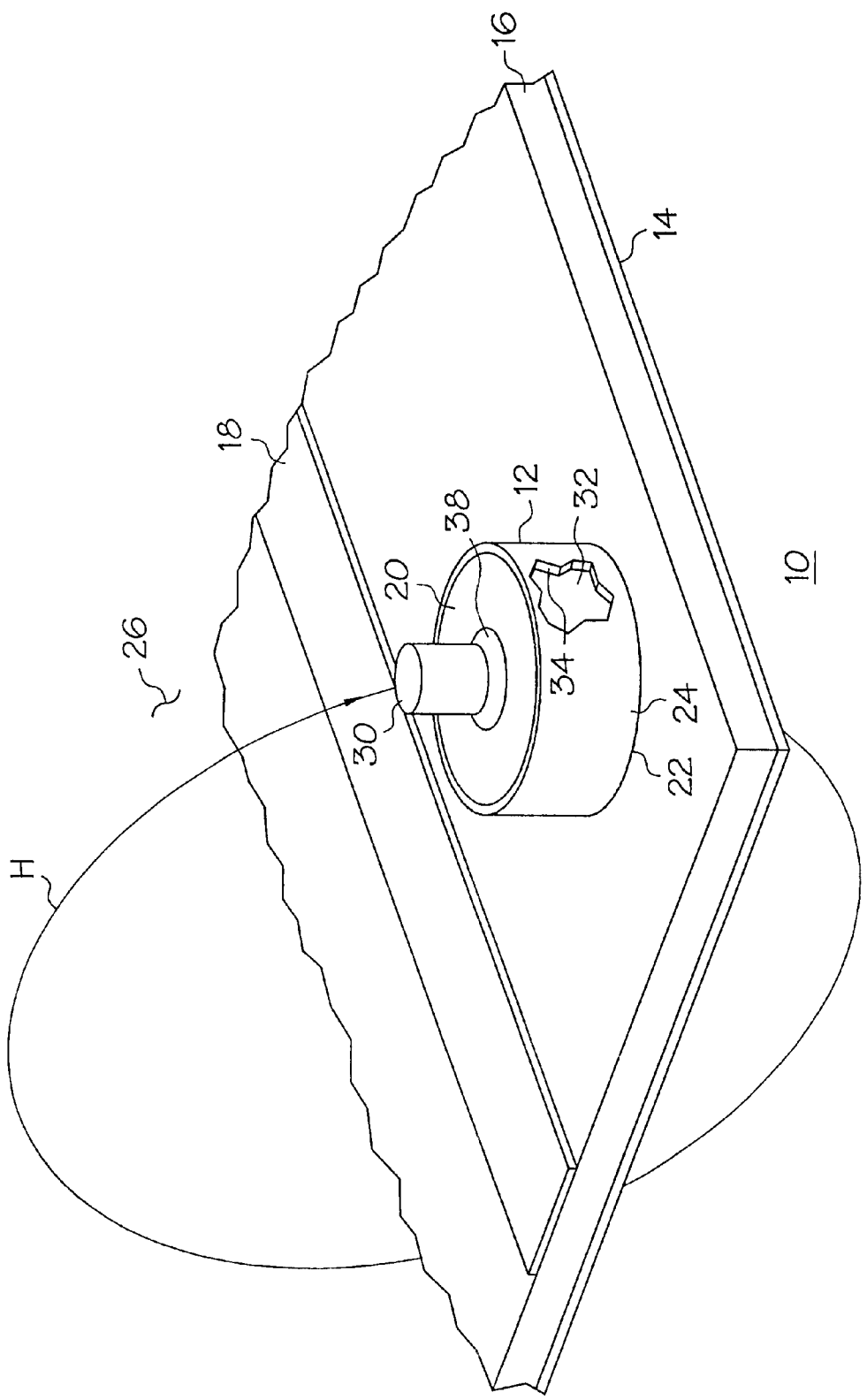
FIG. 1 shows a cut-away perspective view of a physical layout for a circuit which includes a tunable $HE_{0\gamma\delta}$ mode dielectric resonator.

FIG. 1 shows a cut-away perspective view of a physical layout for a section of a circuit 10 which includes a tunable $HE_{0\gamma\delta}$ mode dielectric resonator 12. Circuit 10 is a microstrip circuit, such as may be included in an oscillator or filter (not shown). Circuit 10 includes a conductive ground plane 14 underlying a dielectric substrate 16. A conductive microstrip trace 18 is clad to the side of substrate 16 that opposes ground plane 14.

Resonator 12 is preferably configured in a generally cylindrical geometry and has a top end 20 which opposes a bottom end 22 and is spaced apart from bottom end 22 by a distance defined by a closed curved wall 24 that extends between ends 20 and 22. Resonator 12 is mounted near trace 18 on the side of substrate 16 that carries trace 18. Bottom end 22 forms a boundary with substrate 16, and top end 20 forms a boundary with air 26. An axis of resonator 12 extends substantially perpendicular to substrate 16.

Resonator 12 may be mounted to substrate 16 using a suitable dielectric adhesive (not shown), or in any other manner known to those skilled in the art.

In the preferred embodiment, an electromagnetic signal having a frequency in the range of 0.3 to 10.0 GHz is impressed upon a transmission line formed from trace 18 and ground plane 14. While higher frequency signals may also be used, the beneficial size advantages of resonator 12 achieved for such higher frequencies are not as pronounced as in the preferred frequency range of 0.3 to 10.0 GHz. This signal produces a magnetic field having field lines surrounding trace 18, as designated by the letter H in FIG. 1. Due to the proximity of resonator 12 to trace 18 and to the orientation of resonator 12, magnetic field H is strongly coupled to resonator 12 in the tangential direction, which extends between top and bottom ends 20 and 22 of resonator 12.

Of course, those skilled in the art will appreciate that resonator 12 is not limited to being used in a microstrip circuit or to the precise manner of coupling discussed above. Rather, microstrip circuit 10 merely represents one of many possible useful circuits within which resonator 12 may be used.

Figure 2:
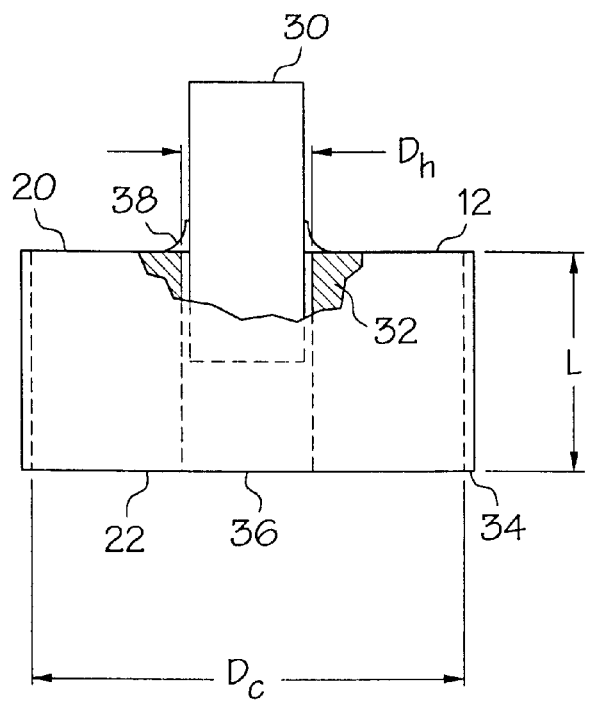
FIG. 2 shows a cut-away side view of the tunable $HE_{0\gamma\delta}$ mode dielectric resonator.
Figure 3:
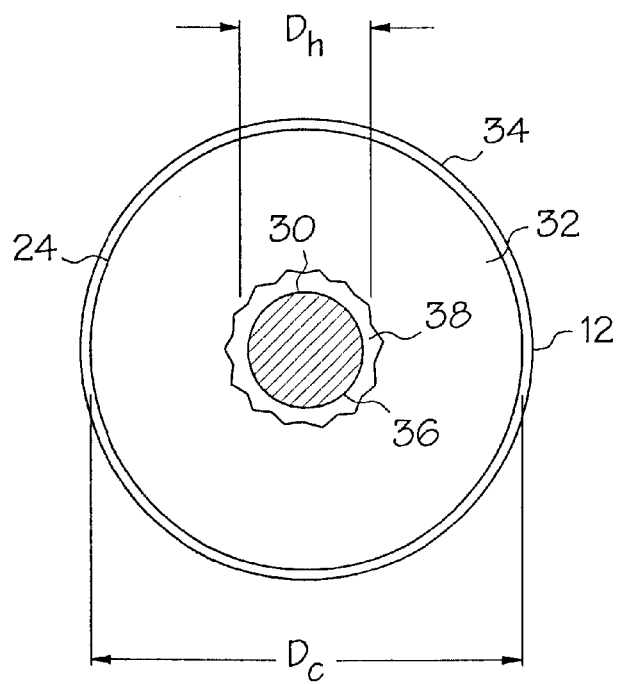
FIG. 3 shows a top view of the tunable $HE_{0\gamma\delta}$ mode dielectric resonator.

FIG. 2 shows a side view and FIG. 3 shows a top view of a first embodiment of $HE_{0\gamma\delta}$ mode dielectric resonator 12. Referring to FIGS. 1–3, resonator 12 is configured to have a lowest resonant frequency at a fractional mode in both the radial and axial directions. The "$\gamma$" and "$\delta$" subscripts in the $HE_{0\gamma\delta}$ mode designation represent fractional periodicities in radial and axial directions, respectively. In particular, resonator 12 is formed from a tuning plug 30, a dielectric disk 32, and a conductive wall 34.

Disk 32 is formed from a substantially homogeneous dielectric material in the preferred embodiment. The selected material preferably has a dielectric constant ($\in_r$) >40. In addition, this material preferably exhibits an unloaded quality factor (Q)>3000 in the desired frequency range of 0.3–10.0 GHz. Materials having higher dielectric constants are more desirable than those with lower dielectric constants because such materials allow the dimensions of resonator 12 to shrink accordingly for a given resonant frequency. Likewise, materials having higher Q values are more desirable than those with lower Q value materials because higher Q values allow resonator 12 to exhibit a higher quality factor.

Accordingly, the dielectric material from which disk 32 is formed is selected to balance a high dielectric constant parameter against quality factor. Any of a variety of dielectric materials known to those skilled in the art which meet the desired dielectric constant and quality factor criteria may be used for disk 32.

Conductive wall 34, is desirably a highly conductive material, such as copper, silver or gold. In the preferred embodiment, conductive wall 34 is a coating that is applied to closed curve wall 24 of resonator 12 so that it substantially entirely covers wall 24, but conductive wall 34 desirably does not cover a significant portion of either top or bottom ends 20 and 22.

As an applied coating, conductive wall 34 may be depicted in exaggerated thickness relative to the dimensions of disk 32 in the figures for clarity. Not only does coating 34 refrain from coating top and bottom ends 20 and 22, but no other conductor is permitted to contact top and bottom ends 20 and 22 in the preferred embodiment.

An axially aligned hole 36 penetrates into resonator 12 from the centers of top and bottom sides 20 and 22 and extends entirely through resonator 12 between sides 20 and 22. Resonator 12 has a cylinder diameter $D_c$. Cylinder diameter $D_c$ defines the diameter of dielectric disk 32, but conductive wall 34 may be sufficiently thin that diameter $D_c$ can also be viewed as the diameter of resonator 12. Hole 36 has a diameter $D_h$ that allows resonator 12 to be effective when less than $0.2\ D_c$. The use of a hole having this size, in combination with conductive wall 34, allows the $HE_{0\gamma\delta}$ mode to be fundamental, with a $TE_{0\gamma\delta}$ mode being the next highest resonant frequency. All other things remaining constant, smaller holes are preferred to further separate the $HE_{0\gamma\delta}$ and $TE_{0\gamma\delta}$ modes of resonance, but holes that are too small lead to unreliable tuning and small tuning ranges.

Conductive wall 34 is not extended within hole 36. The boundary of dielectric disk 32 within hole 36 and at top and bottom ends 20 and 22 is formed with a different dielectric material. The dielectric constants of these different boundary materials are desirably significantly less than dielectric constant $\in_r$ of disk 32. These boundary materials include air 26 at top end 20 and inside a portion of hole 36, tuning plug 30 inside a portion of hole 36, and substrate 16 and/or an adhesive at bottom end 22. Effective results are achieved when such boundary materials exhibit dielectric constants less than $0.5\in_r$, where $\in_r$ is the dielectric constant of disk 32.

Since dielectric resonator 12 is configured for HE mode resonance, tuning plug 30 is desirably formed from a dielectric material having a significantly lower dielectric constant than the material from which dielectric disk 32 is formed. A suitable tuning range and separation between $HE_{0\gamma\delta}$ and $TE_{0\gamma\delta}$ modes of resonance can be maintained when the dielectric constant of tuning plug 30 is less than $0.5\in_r$, where $\in_r$ is the dielectric constant of disk 32. In the preferred embodiment, the dielectric constant of tuning plug 30 is less than 20 while the dielectric constant of disk 32 is greater than 40.

In order to maintain the quality factor of resonator 12 as high as possible, given the HE mode of resonance, tuning plug 30 exhibits an unloaded quality factor as high as practical. Desirably, the unloaded quality factor of tuning plug 30 in the frequency range of interest is greater than 2Q, where Q is the unloaded quality factor of dielectric disk 32. This parameter allows tuning to take place without exerting a significant influence on the overall quality factor of resonator 12.

One material that is well suited for use as tuning plug 30 is alumina. Alumina typically exhibits a dielectric constant in the range of 4–10 and an unloaded quality factor greater than 10,000. In addition, alumina is mechanically stable, easily formed in desired shapes and sizes, readily available commercially, and relatively inexpensive compared to materials conventionally used in forming useful dielectric resonators. Accordingly, alumina is an inexpensive material that promotes a wide tuning range for the $HE_{0\gamma\delta}$ mode resonance, maintains separation between the $HE_{0\gamma\delta}$ and $TE_{0\gamma\delta}$ modes of resonance throughout the tuning range, and does not significantly alter the quality factor of dielectric resonator 12 over the tuning range. However, those skilled in the art will appreciate that other materials may be used in forming tuning plug 30 with suitable results.

In the preferred embodiment depicted in the figures, tuning plug 30 is dimensioned as a cylinder having indeterminate axial length and a diameter slightly smaller than the diameter $D_h$ of hole 36 in disk 32. Tuning is accomplished by inserting tuning plug 30 into hole 36 through top end 20 of dielectric resonator 12 to a desired depth within dielectric resonator 12 where a desired resonant frequency is exhibited. Once this desired depth is reached, tuning plug 30 should extend within hole 36 only partially through disk 32 between top and bottom ends 20 and 22.

Desirably, the diameter of tuning plug 30 is sufficiently smaller than diameter $D_h$ so that different thermal expansion coefficients exhibited by dielectric disk 32 and tuning plug 30 do not cause undue stress in tuning plug 30 or disk 32 as dielectric resonator 12 operates over a desired temperature range. Otherwise, the diameter of tuning plug 30 is desirably as large as possible within this constraint. When a desired depth is reached in the tuning process, a suitable dielectric adhesive fillet 38 may be applied between tuning plug 30 and dielectric disk 32 to operate as a fastener that affixes tuning plug 30 to dielectric disk 32 in a fixed relationship.

In another preferred embodiment (not shown) mating threads may be formed in tuning plug 30 and in the wall of dielectric disk 32 surrounding hole 36 so that tuning plug 30 is inserted into and retracted from hole 36 by screwing or otherwise twisting. When a desired depth is reached, adhesive fillet 38 may optionally be applied to lock tuning plug 30 in place relative to disk 32. In this embodiment, such mating threads may also serve as a fastener that affixes tuning plug 30 to disk 32.

An axial length (L) defines the distance between top and bottom ends 20 and 22. Resonator 12 is configured so that cylinder diameter $D_c$ is roughly $0.5\lambda/\sqrt{\in_r}$ or less and so that axial length L of resonator 12 is less than $0.25\lambda/\sqrt{\in_r}$, where $\lambda$ is the wavelength of the lowest resonant frequency of resonator 12 in empty space.

The electric field intensity within resonator 12 at the lowest resonant frequency experiences a zero at the electric wall formed at curved wall 24 by the application of conductive wall 34. Accordingly, the dimensions of resonator 12, and particularly of cylinder diameter $D_c$, exert a large influence on the lowest resonant frequency for resonator 12.

The forcing of the electric field intensity to equal zero at wall 24 allows a standing wave to build within and without dielectric resonator 12 at a frequency having a wavelength determined by cylinder diameter $D_c$. Less than 0.5, and with preferential selection of hole diameter $D_h$ and dielectric constant $\in_r$, less than 0.4, of a wavelength resides within resonator 12 in the radial direction at the lowest resonant frequency. Likewise, by forming a boundary with a low dielectric constant material at top and bottom ends 20 and 22, less then 0.25 of a wavelength resides within resonator 12 in the axial direction at the lowest resonant frequency. In comparison with the $TE_{0\gamma\delta}$ mode dielectric resonator configured as described in U.S. Pat. No. 6,169,467, a savings in the volume of $HE_{0\gamma\delta}$ mode dielectric resonator 12 of at least 10%, and typically around 25%, is realized.

In summary, the present invention provides an improved $HE_{0\gamma\delta}$ mode dielectric resonator. A $HE_{0\gamma\delta}$ mode dielectric resonator is provided which achieves a good Q in a smaller space than is required by a TE mode dielectric resonator or other HE mode dielectric resonators at the same frequency. A tunable $HE_{0\gamma\delta}$ mode dielectric resonator is provided. The tunable $HE_{0\gamma\delta}$ mode dielectric resonator is provided wherein tuning is accomplished at very low cost and with substantially no deterioration in quality factor.

Although the preferred embodiments of the invention have been illustrated and described in detail, it will be readily apparent to those skilled in the art that various modifications may be made therein without departing from the spirit of the invention or from the scope of the appended claims. For example, while the present invention depicts round form factors for a dielectric disk and hole therein, those skilled in the art will understand that other form factors may be used to generate equivalent dielectric resonators using the teaching provided herein.

What is claimed is:

1. A tunable $HE_{0\gamma\delta}$ mode dielectric resonator comprising:

a disk formed in the shape of a cylinder having a diameter D and formed from a first dielectric material configured to exhibit a dielectric constant $\in_r$, said disk having first and second opposing ends and a closed curve wall extending between said first and second ends, said disk having a hole exhibiting a diameter less than 0.2 D penetrating therein from said first end and extending toward said second end, wherein at least one of said first and second ends serves as a boundary between said disk and a second dielectric material;

a conductive coating on said wall; and a dielectric tuning plug having a dielectric constant less than $0.5\in_r$ extending into said hole in said disk, wherein said resonator has a lowest resonant frequency in a $HE_{0\gamma\delta}$ mode.

2. A tunable $HE_{0\gamma\delta}$ mode dielectric resonator as claimed in claim 1 wherein said conductive coating covers substantially said entire wall.

3. A tunable $HE_{0\gamma\delta}$ mode dielectric resonator as claimed in claim 1 wherein said conductive coating does not cover a substantial portion of said first end and said conductive coating does not cover a substantial portion of said second end.

4. A tunable $HE_{0\gamma\delta}$ mode dielectric resonator as claimed in claim 1 wherein said dielectric material from which said disk is formed exhibits a dielectric constant of at least 40.

5. A tunable $HE_{0\gamma\delta}$ mode dielectric resonator as claimed in claim 1 wherein said hole extends through said disk from said first end to said second end.

6. A tunable $HE_{0\gamma\delta}$ mode dielectric resonator as claimed in claim 1 wherein:

said lowest resonant frequency has a wavelength $\lambda$; and said disk has a diameter less than $\lambda/(2\sqrt{\in_r})$.

7. A tunable $HE_{0\gamma\delta}$ mode dielectric resonator as claimed in claim 1 wherein:

said disk has an axial distance of less than $\lambda/(4\sqrt{\in_r})$.

8. A tunable $HE_{0\gamma\delta}$ mode dielectric resonator as claimed in claim 1 wherein said dielectric tuning plug exhibits a dielectric constant of less than 20.

9. A tunable $HE_{0\gamma\delta}$ mode dielectric resonator as claimed in claim 1 wherein said tuning plug is formed of alumina.

10. A tunable $HE_{0\gamma\delta}$ mode dielectric resonator as claimed in claim 1 wherein said tuning plug is affixed to said disk.

11. A tunable $HE_{0\gamma\delta}$ mode dielectric resonator as claimed in claim 10 additionally comprising a fastener coupled to said tuning plug and said disk to retain said tuning plug in a fixed relationship to said disk.

12. A tunable $HE_{0\gamma\delta}$ mode dielectric resonator as claimed in claim 1 wherein said tuning plug extends within said hole only partially through said disk between said first and second ends.

13. A tunable $HE_{0\gamma\delta}$ mode dielectric resonator as claimed in claim 1 wherein:

said dielectric material from which said disk is formed exhibits an unloaded quality factor of Q; and said dielectric tuning plug exhibits an unloaded quality factor greater than 2Q.

14. A tunable $HE_{0\gamma\delta}$ mode dielectric resonator as claimed in claim 1 wherein said second dielectric material is air.

15. A tunable $HE_{0\gamma\delta}$ mode dielectric resonator comprising:

a disk formed in the shape of a cylinder having a diameter D and formed from a first dielectric material configured to exhibit a dielectric constant greater than 40, said disk having first and second opposing ends and a closed curve wall extending between said first and second ends, said disk having a hole exhibiting a diameter less than 0.2 D penetrating therein from said first end and extending toward said second end, wherein at least one of said first and second ends serves as a boundary between said disk and a second dielectric material;

a conductive coating on said wall; and a dielectric tuning plug extending into and affixed to said disk, said dielectric tuning plug exhibiting a dielectric constant of less than 20, wherein said resonator has a lowest resonant frequency in a $HE_{0\gamma\delta}$ mode.

16. A tunable $HE_{0\gamma\delta}$ mode dielectric resonator as claimed in claim 15 wherein said tuning plug is formed of alumina.

17. A tunable $HE_{0\gamma\delta}$ mode dielectric resonator as claimed in claim 15 wherein:

said dielectric material from which said disk is formed exhibits an unloaded quality factor of Q; and said dielectric tuning plug exhibits an unloaded quality factor greater than 2Q.

18. A tunable $HE_{0\gamma\delta}$ mode dielectric resonator as claimed in claim 15 wherein:

said lowest resonant frequency has a wavelength $\lambda$; and said disk has a diameter less than $\lambda/(2\sqrt{\epsilon_r})$.

19. A tunable $HE_{0\gamma\delta}$ mode dielectric resonator as claimed in claim 18 wherein:

said disk has an axial distance of less than $\lambda/(4\sqrt{\epsilon_r})$.

20. A tunable $HE_{0\gamma\delta}$ mode dielectric resonator comprising:

a disk formed from a first dielectric material exhibiting a dielectric constant $\epsilon_r$ greater than 40 and an unloaded quality factor of Q and formed in the shape of a cylinder having a diameter D less than $\lambda/(2\sqrt{\epsilon_r})$, wherein $\lambda$ is a wavelength of a lowest resonant frequency of said resonator, said disk having first and second opposing ends and a closed curve wall extending between said first and second ends, said disk having an axial distance between said first and second ends of less than $\lambda/(4\sqrt{\epsilon_r})$, and said disk having a hole exhibiting a diameter less than 0.2 D extending from said first end to said second end, wherein at least one of said first and second ends serves as a boundary between said disk and air;

a conductive coating on said wall; and a dielectric tuning plug extending into and affixed to said disk, said dielectric tuning plug exhibiting a dielectric constant of less than 20 and a quality factor greater than 2Q, wherein said resonator has a lowest resonant frequency in a $HE_{0\gamma\delta}$ mode.

* * * * *